(12) United States Patent
McAlister

(10) Patent No.: US 9,394,169 B2
(45) Date of Patent: Jul. 19, 2016

(54) GAS HYDRATE CONVERSION SYSTEM FOR HARVESTING HYDROCARBON HYDRATE DEPOSITS

(71) Applicant: McAlister Technologies, LLC, Phoenix, AZ (US)

(72) Inventor: Roy Edward McAlister, Phoenix, AZ (US)

(73) Assignee: McAlister Technologies, LLC, Phoenix, AZ (US)

(*) Notice: Subject to any disclaimer, the term of this patent is extended or adjusted under 35 U.S.C. 154(b) by 51 days.

(21) Appl. No.: 14/149,740

(22) Filed: Jan. 7, 2014

(65) Prior Publication Data

US 2014/0120025 A1 May 1, 2014

Related U.S. Application Data

(60) Division of application No. 12/857,228, filed on Aug. 16, 2010, now Pat. No. 8,623,107, and a continuation-in-part of application No. 12/707,651, filed on Feb. 17, 2010, now Pat. No. 8,075,748, and a (Continued)

(51) Int. Cl.
| | |
|---|---|
| *C01B 3/24* | (2006.01) |
| *C23C 16/26* | (2006.01) |
| *C30B 25/08* | (2006.01) |

(Continued)

(52) U.S. Cl.
CPC . *C01B 3/24* (2013.01); *C01B 31/02* (2013.01); *C23C 16/26* (2013.01); *C23C 16/4581* (2013.01); *C23C 16/4583* (2013.01); *C23C 16/46* (2013.01); *C30B 25/08* (2013.01); *C30B 25/10* (2013.01); *C30B 29/02* (2013.01); *H01M 8/0606* (2013.01); *C01B 2203/0266* (2013.01); *C01B 2203/84* (2013.01);

(Continued)

(58) Field of Classification Search
USPC ................ 48/61; 423/644; 299/8, 9; 37/307; 166/352
See application file for complete search history.

(56) References Cited

U.S. PATENT DOCUMENTS

| | | |
|---|---|---|
| 4,815,815 A | 3/1989 | Mori |
| 5,055,435 A | 10/1991 | Hamanaka et al. |

(Continued)

FOREIGN PATENT DOCUMENTS

| | | |
|---|---|---|
| WO | 9423993 | 10/1994 |
| WO | 2010096503 | 8/2010 |

(Continued)

OTHER PUBLICATIONS

International Search Report and Written Opinion for Application No. PCT/US2010/045629; Applicant: McAlister, Roy E., et al.; Date of Mailing: Feb. 5, 2013; 15 pages.

*Primary Examiner* — Matthew Merkling
(74) *Attorney, Agent, or Firm* — Perkins Coie LLP

(57) ABSTRACT

In one embodiment, a gas hydrate conversion system is provided comprising a floating factory, an appendage for harvesting a gas hydrate from an oceanic hydrate deposit, and one or more storage tanks. The floating factory comprises one or more heat exchange assemblies, one or more heat pump assemblies and an engine. In another embodiment, a method for harvesting hydrocarbon hydrate deposits is provided, the method comprising providing a gas hydrate conversion system; inducing release of methane from an oceanic hydrate deposit; capturing the methane from a primary methane capture zone and/or a secondary methane capture zone; and converting the methane to hydrogen and carbon.

8 Claims, 5 Drawing Sheets

Related U.S. Application Data continuation-in-part of application No. PCT/US2010/024497, filed on Feb. 17, 2010, and a continuation-in-part of application No. 12/707,653, filed on Feb. 17, 2010, now Pat. No. 8,172,990, and a continuation-in-part of application No. PCT/US2010/024498, filed on Feb. 17, 2010, and a continuation-in-part of application No. 12/707,656, filed on Feb. 17, 2010, now Pat. No. 8,075,749, and a continuation-in-part of application No. PCT/US2010/024499, filed on Feb. 17, 2010.

(60) Provisional application No. 61/304,403, filed on Feb. 13, 2010, provisional application No. 61/153,253, filed on Feb. 17, 2009, provisional application No. 61/237,476, filed on Aug. 27, 2009.

(51) Int. Cl.
*C30B 25/10* (2006.01)
*C30B 29/02* (2006.01)
*C23C 16/46* (2006.01)
*H01M 8/06* (2016.01)
*C23C 16/458* (2006.01)
*C01B 31/02* (2006.01)
*E21B 43/01* (2006.01)

(52) U.S. Cl.
CPC ......... *E21B 2043/0115* (2013.01); *Y02E 60/50* (2013.01); *Y02P 20/129* (2015.11); *Y10T 137/6416* (2015.04)

(56) References Cited

U.S. PATENT DOCUMENTS

| | | | |
|---|---|---|---|
| 5,450,728 A | 9/1995 | Vora et al. | |
| 5,467,722 A | 11/1995 | Meratla | |
| 5,642,630 A | 7/1997 | Abdelmalek et al. | |
| 5,772,733 A | 6/1998 | Lokhandwala et al. | |
| 5,902,906 A | 5/1999 | Senaratne et al. | |
| 5,941,098 A | 8/1999 | Guillard et al. | |
| 5,950,732 A * | 9/1999 | Agee et al. | 166/354 |
| 6,178,670 B1 | 1/2001 | Susman et al. | |
| 6,220,052 B1 | 4/2001 | Tate, Jr. et al. | |
| 6,220,053 B1 | 4/2001 | Hass, Jr. et al. | |
| 6,237,347 B1 | 5/2001 | Rigby et al. | |
| 6,299,256 B1 | 10/2001 | Wyatt | |
| 6,490,883 B2 | 12/2002 | Trembley et al. | |
| 6,973,968 B2 | 12/2005 | Pfefferle | |
| 6,994,159 B2 | 2/2006 | Wendland | |
| 7,001,586 B2 | 2/2006 | Wang et al. | |
| 7,255,794 B2 | 8/2007 | Max et al. | |
| 7,343,971 B2 | 3/2008 | Pfefferle | |
| 7,546,880 B2 | 6/2009 | Zhang et al. | |
| 7,628,137 B1 | 12/2009 | McAlister | |
| 8,004,102 B2 | 8/2011 | Rauch et al. | |
| 8,075,748 B2 | 12/2011 | McAlister | |
| 8,075,749 B2 | 12/2011 | McAlister | |
| 8,147,599 B2 | 4/2012 | McAlister | |
| 8,172,990 B2 | 5/2012 | McAlister | |
| 8,297,254 B2 | 10/2012 | McAlister | |
| 8,312,759 B2 | 11/2012 | McAlister | |
| 8,441,361 B2 | 5/2013 | McAlister | |
| 8,623,107 B2 | 1/2014 | McAlister | |
| 8,641,810 B2 | 2/2014 | McAlister | |
| 8,940,265 B2 | 1/2015 | McAlister | |
| 8,991,182 B2 | 3/2015 | McAlister | |
| 9,051,909 B2 | 6/2015 | McAlister | |
| 9,097,152 B2 | 8/2015 | McAlister | |
| 9,133,552 B2 | 9/2015 | McAlister | |
| 2002/0009338 A1 | 1/2002 | Blum et al. | |
| 2004/0118447 A1 | 6/2004 | Muhs et al. | |
| 2005/0063900 A1 | 3/2005 | Wang et al. | |
| 2005/0072301 A1 | 4/2005 | Baciu | |
| 2005/0092482 A1 | 5/2005 | Wendland | |
| 2006/0005572 A1 | 1/2006 | Wikstrom et al. | |
| 2006/0112911 A1 | 6/2006 | Lawrence et al. | |
| 2007/0017243 A1 | 1/2007 | Kidwell et al. | |
| 2007/0240705 A1 | 10/2007 | Papadopoulos | |
| 2009/0124520 A1 | 5/2009 | Tohidi | |
| 2009/0133732 A1 | 5/2009 | Hsia et al. | |
| 2009/0199828 A1 | 8/2009 | Luttgeharm | |
| 2011/0061376 A1 | 3/2011 | McAlister | |
| 2011/0064644 A1 | 3/2011 | McAlister | |
| 2011/0070510 A1 | 3/2011 | McAlister | |
| 2011/0076445 A1 | 3/2011 | McAlister | |
| 2011/0081586 A1 | 4/2011 | McAlister | |
| 2012/0060554 A1 | 3/2012 | Schmidt | |
| 2012/0145560 A1 | 6/2012 | McAlister | |
| 2013/0240369 A1 | 9/2013 | McAlister | |
| 2014/0095263 A1 | 4/2014 | McAlister | |
| 2014/0125052 A1 | 5/2014 | McAlister | |
| 2014/0260416 A1 | 9/2014 | McAlister | |
| 2014/0326597 A1 | 11/2014 | McAlister | |
| 2015/0010450 A1 | 1/2015 | McAlister | |
| 2015/0121869 A1 | 5/2015 | McAlister | |
| 2015/0184532 A1 | 7/2015 | McAlister | |

FOREIGN PATENT DOCUMENTS

| | | |
|---|---|---|
| WO | 2010096504 | 8/2010 |
| WO | 2010096505 | 8/2010 |

* cited by examiner

GAS HYDRATE CONVERSION SYSTEM FOR HARVESTING HYDROCARBON HYDRATE DEPOSITS

CROSS-REFERENCE TO RELATED APPLICATIONS

The present application is a divisional of U.S. patent application Ser. No. 12/857,228, filed Aug. 16, 2010, now U.S. Pat. No. 8,623,107, and titled GAS HYDRATE CONVERSION SYSTEM FOR HARVESTING HYDROCARBON HYDRATE DEPOSITS, which claims priority to and the benefit of U.S. Provisional Application No. 61/304,403, filed Feb. 13, 2010 and titled FULL SPECTRUM ENERGY AND RESOURCE INDEPENDENCE. U.S. patent application Ser. No. 12/857,228 is a continuation-in-part of each of the following applications: U.S. patent application Ser. No. 12/707,651, filed Feb. 17, 2010, now U.S. Pat. No. 8,075,748, and titled ELECTROLYTIC CELL AND METHOD OF USE THEREOF; PCT Application No. PCT/US10/24497, filed Feb. 17, 2010 and titled ELECTROLYTIC CELL AND METHOD OF USE THEREOF; U.S. patent application Ser. No. 12/707,653, filed Feb. 17, 2010, now U.S. Pat. No. 8,172,990, and titled APPARATUS AND METHOD FOR CONTROLLING NUCLEATION DURING ELECTROLYSIS; PCT Application No. PCT/US10/24498, filed Feb. 17, 2010 and titled APPARATUS AND METHOD FOR CONTROLLING NUCLEATION DURING ELECTROLYSIS; U.S. patent application Ser. No. 12/707,656, filed Feb. 17, 2010, now U.S. Pat. No. 8,075,749, and titled APPARATUS AND METHOD FOR GAS CAPTURE DURING ELECTROLYSIS; and PCT Application No. PCT/US10/24499, filed Feb. 17, 2010 and titled APPARATUS AND METHOD FOR CONTROLLING NUCLEATION DURING ELECTROLYSIS; each of which claims priority to and the benefit of the following applications: U.S. Provisional Patent Application No. 61/153,253, filed Feb. 17, 2009 and titled FULL SPECTRUM ENERGY; U.S. Provisional Patent Application No. 61/237,476, filed Aug. 27, 2009 and titled ELECTROLYZER AND ENERGY INDEPENDENCE TECHNOLOGIES; U.S. Provisional Application No. 61/304,403, filed Feb. 13, 2010 and titled FULL SPECTRUM ENERGY AND RESOURCE INDEPENDENCE. Each of these applications is incorporated by reference in its entirety.

BACKGROUND

Hydrocarbons such as methane and carbon dioxide that are captured in ice crystals on the world's ocean floors store more energy than all fossil fuel reserves of coal, oil, and natural gas. Although these deposits provide a tremendous source of reusable energy, release and leakage of methane and other greenhouse gases pose a serious threat to the Earth's atmosphere. Analysis of arctic snow cores has shown that Earth's atmosphere contains about two times as much methane and thirty percent more carbon dioxide compared to any other time in the last 160,000 years. These greenhouse gases cause deleterious changes in the atmosphere. Increased presence of greenhouse gases results in greater trapping and accumulation of solar energy in the atmosphere, causing evaporation of the oceans and facilitates global climate change such as more frequent and more powerful hurricanes, torrential rainstorms and floods, more frequent tornadoes and lightning strikes, thereby resulting in increased weather-related economic loss and damages to human investments in farms, homes, and other industrial ventures.

The world population and demand for energy has grown to the point of requiring more oil than can be produced. To maintain the progress achieved by the Industrial Revolution that currently depends upon annually burning fossil resources that took more than one million years to accumulate, alternative sources of energy need to be utilized to produce sufficient energy to meet the ever-increasing energy demands of a growing population along with greater demand per person.

Previous efforts to harvest and produce energy from methane hydrates on the ocean floor have failed because of difficult problems including:

Oceanic hazards such as storms, corrosion, biofouling, and collision hazards with ship traffic.

Difficult ocean floor terrain such as adversely sloping areas where methane hydrate deposits are found. In addition, depending upon the temperature, hydrates may only be stable at depths greater than 1000'.

Unstable environmental conditions including the factors of (1) and (2) combined with the unstable nature of the methane hydrate deposits at temperatures above the freezing point of ice and at pressures less than about 480 psi.

Expense and inefficiency of storage and transport of hydrocarbon hydrates. In addition to the factors discussed above, methane hydrate is relatively low in energy storage density because it is mostly water in the form of an ice crystal that surrounds a molecule of methane.

Difficult mining situations with a high degree of environmental impact. Conventional approaches to mine values from the unconsolidated thin gas hydrate deposits that are mixed with silt and limestone on the ocean floor cause unacceptable production costs and environmental impact.

It is therefore an object of some embodiments described below to provide a system and method for harvesting gas hydrates to reduce their effects on the atmosphere and converting the gas hydrates to usable sources of energy and durable goods.

SUMMARY

In one embodiment, a gas hydrate conversion system is provided comprising a floating factory, an appendage for harvesting a gas hydrate from an oceanic hydrate deposit, and one or more storage tanks. The floating factory comprises one or more heat exchange assemblies, one or more heat pump assemblies and an engine.

In another embodiment, a gas hydrate conversion system is provided, the system comprising a floating factory, an appendage for harvesting a gas hydrate from an oceanic hydrate deposit, one or more storage tanks, and a solar energy apparatus. The floating factory in the system described above comprises one or more heat exchange assemblies, one or more heat pump assemblies, and an engine. The solar energy apparatus comprises a light conduit, a solar collector and a light distributor.

In one embodiment, the engine may be a turbine engine, a turbo generator or a combustion engine. In another embodiment, the gas hydrate is methane. In other embodiments, the floating factory further comprises a furnace and/or a set of filters for separating harvested gas hydrates and/or separating exhaust gases.

In one embodiment, the appendage for harvesting a gas hydrate comprises a heat distributor for delivering warm water to the oceanic hydrate deposit, a moveable pickup bell for capturing the gas hydrates from an inner capture zone, an outer flexible skirt for capturing the gas hydrates from an outer capture zone, and a hydrate conduit that carries the gas hydrates to the floating factory.

In other embodiments, the conversion system described above further comprises a robot spray cleaning system (RSCS), and/or a return distributor.

In a further embodiment, a method for harvesting hydrocarbon hydrate deposits is provided, the method comprising providing a gas hydrate conversion system; inducing release of methane from an oceanic hydrate deposit, capturing the methane from a primary methane capture zone and/or a secondary methane capture zone, and converting the methane to hydrogen and carbon.

Other features and advantages of the present invention will become apparent from the following detailed description. It should be understood, however, that the detailed description and the specific examples, while indicating the preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

In the drawings, wherein the same reference number indicates the same element throughout the views.

DETAILED DESCRIPTION

Figure 1:
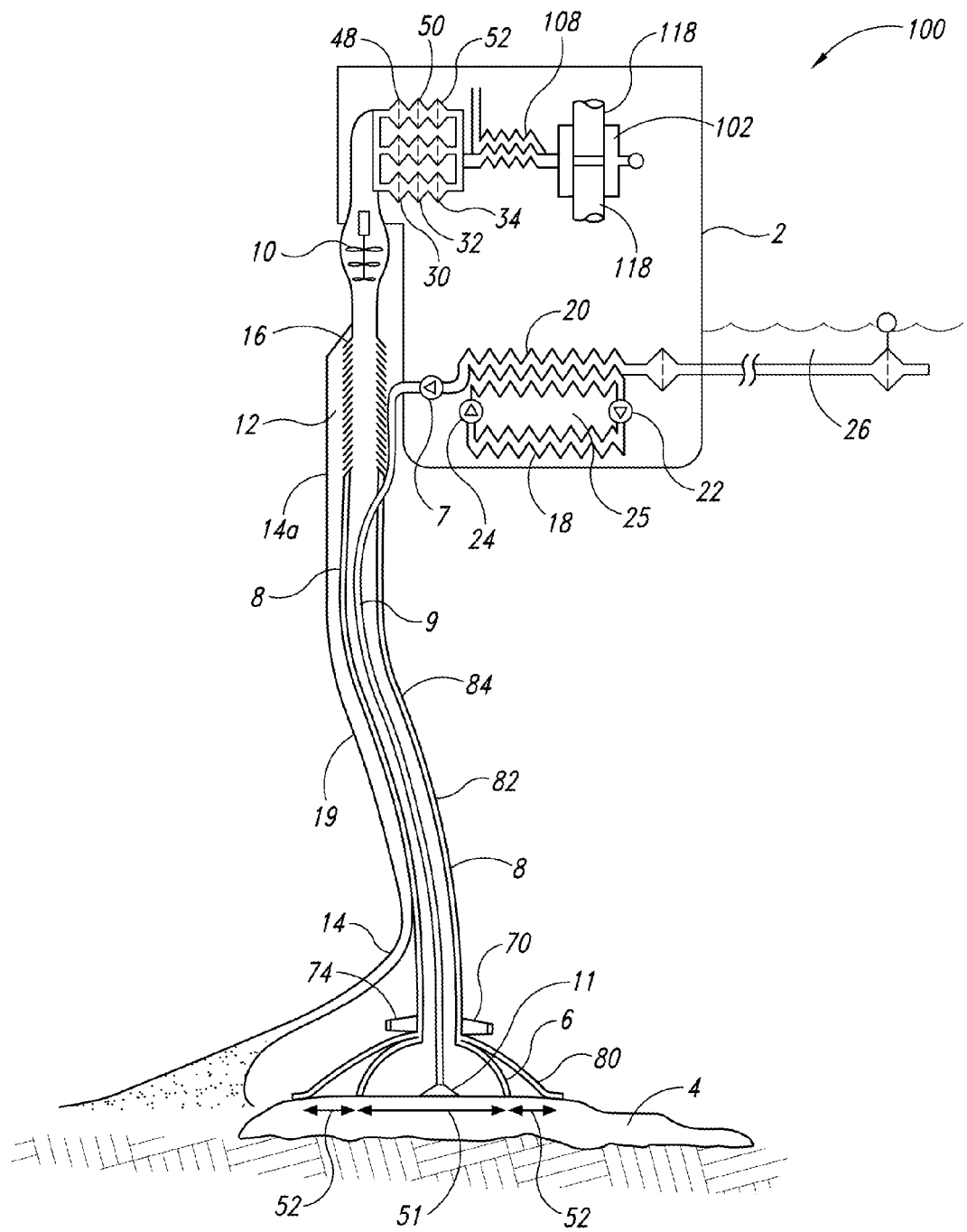
FIG. 1 is an end view of a gas hydrate conversion system that extracts methane from gas hydrate deposits and produces various products in accordance with one embodiment.

The present application incorporates by reference in its entirety the subject matter of U.S. Provisional Patent Application No. 60/626,021, filed Nov. 9, 2004 and titled MULTI-FUEL STORAGE, METERING AND IGNITION SYSTEM. The present application also incorporates by reference in their entirety the subject matter of each of the following U.S. patent applications, filed concurrently herewith on Aug. 16, 2010 and titled: METHODS AND APPARATUSES FOR DETECTION OF PROPERTIES OF FLUID CONVEYANCE SYSTEMS, which is U.S. patent application Ser. No. 12/806,634, now U.S. Pat. No. 8,441,361; COMPREHENSIVE COST MODELING OF AUTOGENOUS SYSTEMS AND PROCESSES FOR THE PRODUCTION OF ENERGY, MATERIAL RESOURCES AND NUTRIENT REGIMES, which is U.S. Patent Application No. 61/401,699; SUSTAINABLE ECONOMIC DEVELOPMENT THROUGH INTEGRATED PRODUCTION OF RENEWABLE ENERGY, MATERIALS RESOURCES, AND NUTRIENT REGIMES, which is U.S. patent application Ser. No. 12/857,553, now U.S. Pat. No. 8,940,265; SYSTEMS AND METHODS FOR SUSTAINABLE ECONOMIC DEVELOPMENT THROUGH INTEGRATED FULL SPECTRUM PRODUCTION OF RENEWABLE ENERGY, which is U.S. patent application Ser. No. 12/857,541, now U.S. Pat. No. 9,231,267; SYSTEMS AND METHODS FOR SUSTAINABLE ECONOMIC DEVELOPMENT THROUGH INTEGRATED FULL SPECTRUM PRODUCTION OF RENEWABLE MATERIAL RESOURCES USING SOLAR THERMAL, which is U.S. patent application Ser. No. 12/857,554, now U.S. Pat. No. 8,808,529; INCREASING THE EFFICIENCY OF SUPPLEMENTED OCEAN THERMAL ENERGY CONVERSION (SOTEC) SYSTEMS, which is U.S. patent application Ser. No. 12/857,546, now U.S. Pat. No. 8,991,182; APPARATUSES AND METHODS FOR STORING AND/OR FILTERING A SUBSTANCE, which is U.S. patent application Ser. No. 12/857,515, now U.S. Pat. No. 8,147,599; ENERGY SYSTEM FOR DWELLING SUPPORT, which is U.S. patent application Ser. No. 12/857,502, now U.S. Pat. No. 9,097,152; ENERGY CONVERSION ASSEMBLIES AND ASSOCIATED METHODS OF USE AND MANUFACTURE, which is U.S. patent application Ser. No. 12/857,433; and INTERNALLY REINFORCED STRUCTURAL COMPOSITES AND ASSOCIATED METHODS OF MANUFACTURING, which is U.S. patent application Ser. No. 12/857,461.

In order to fully understand the manner in which the above-recited details and other advantages and objects according to the invention are obtained, a more detailed description of the embodiments will be rendered by reference to specific embodiments thereof.

The present invention is directed to systems and methods to produce and utilize methane, carbon dioxide, fixed nitrogen, trace minerals, carbon, and hydrogen derived from renewable resources. The system and method described herein are also directed to improved production, storage, and transfer of carbon materials, various useful chemical preparations, hydrogen, and energy from gas hydrate deposits.

In one embodiment, a gas hydrate conversion system for harvesting hydrocarbon hydrate deposits and method of its use is provided. Though the gas hydrate conversion system may be used to harvest any type of hydrocarbon hydrate deposits from many types of sources, it is described in this embodiment for use in harvesting methane from gas hydrate deposits on the ocean floor. The current disclosure provides embodiments and combinations of embodiments for optimizing the production of valuable goods such as electricity, hydrogen, nitrogen, carbon dioxide, oleum, sulfuric acid, ammonia, various ammonium compounds, nitric acid, oxides of nitrogen, and a variety of carbon products from feedstock compounds such as potentially troublesome hydrocarbon greenhouse gases along with such feedstocks of fossil origins. In one embodiment, high-value graphite products with novel capabilities are produced.

One skilled in the art will appreciate that aspects of the embodiments disclosed herein can apply to other types of gas hydrate conversion systems to provide similar advantages.

Gas hydrates found at the cold depths of the ocean floor represent a larger hydrocarbon reserve than all of the fossil coal, oil, and natural gas on earth's continents. According to some embodiments, the methods described herein may be used in a process for averting potentially catastrophic releases of greenhouse gases to the atmosphere. This may be accomplished by harvesting and converting ocean floor deposits of hydrocarbon hydrates into energy, hydrogen, and carbon products. Harvested hydrocarbons may be utilized to produce needed goods and energy. Fresh water may be produced by decomposition of harvested gas hydrates or by chemical union of hydrogen and oxygen from air and may be distributed to meet the needs of seaboard communities. Collection and production apparatus are powered by electricity and hydrogen made from hydrocarbons extracted from fragile ice crystals at cold ocean depths.

The embodiments described herein provide a system and associated methods for extracting methane from gas hydrate deposits on the ocean floor with minimal environmental impact. Such system and methods overcome the problems discussed above. Direct and/or indirect solar energy may utilized to release hydrocarbons from ice deposits. The system for extracting methane may capture solar energy at the ocean surface and use it to release methane and other hydrocarbons from hydrate deposits found on the cold, dark ocean floor. Alternatively, the system may harness renewable energy in heat pumping operations to release the methane and other hydrocarbons from hydrate deposits. The embodiments described herein provide a high volume conversion of hydrocarbons into customized carbon materials and hydrogen. The carbon materials and hydrogen may then be used to produce valuable goods as described above. For example, durable goods that contain substantial amounts of carbon such as packaging, fabrics, carpeting, paint and appliances made largely from thermoplastic and thermoset polymers may be produced.

The embodiments further provide additional carbon, graphite, and other products made in large part from carbon for purposes of sequestering the converted carbon from methane and other hydrocarbon greenhouse gases that would otherwise pose a threat to the environment.

In the embodiment described herein, high volume and improved efficiency conversion of hydrocarbons into carbon, carbon products, pyrolitic and other sources of customized graphite, and hydrogen is provided. In one embodiment, the hydrogen may be used for transportation fuel, production of electricity, and manufacture or production of chemicals (e.g., hydrogen, nitrogen, carbon dioxide, ammonia, ammonium compounds, and various forms of carbon). Other objects and advantages will become apparent from the following specification and discussion of the drawings.

Referring to FIG. 1, a gas conversion system 100 having a floating factory 2 within a vessel and a harvesting appendage 19 that extracts methane from gas hydrate deposits 4 at the bottom of the ocean is shown. The extracted methane may be converted to carbon materials and hydrogen to be used to produce various valuable products as described above. A moveable pickup bell 6 may be provided at the distal end of the harvesting appendage 19 that provides a pathway with reduced pressure for the methane and induces the release of methane and other gas hydrates by heating the gas hydrate deposits 4 by a heat distributor 11. Heating of the gas hydrates at the ocean floor to release methane is by a combination of techniques including the use of warm surface water in which pump 7 delivers surface water through conduit 9 to heat distributor 11 within bell 6 where it heats the gas hydrate in the area under the bell. Additional heat from factory operations may be added to warm surface water for this purpose. After warming the gas hydrate sufficiently to release methane the warming water is exhausted by gas-liquid separator assembly including downward opening louvers 12, annular shroud 14, and methane recovery director 16.

The moveable pickup bell 6 is a primary collector of methane and other gas hydrates, released by heating of the gas hydrate deposits 4. At least two zones of methane recovery are provided in conjunction with the harvesting appendage 19. A primary methane capture zone 51 corresponds to the area under the moveable pickup bell (or primary collector) 6 wherein warm water from heat distributor 11 transfers heat to the hydrate deposit 4 to initiate release of methane and uptake by the primary hydrate conduit 8. A secondary capture zone 52 surrounds the primary methane capture zone 51, and corresponds to the area under a flexible skirt (or secondary collector) 80 that prevents escape of continued methane release after the bell has moved away from the primary methane capture zone 51 within a hydrate deposit harvesting area. Methane that is released too slowly to be captured in the primary collection zone 51 and found in the areas behind the movement of the primary collection zone 51 is captured within the secondary methane capture zone 52 under the flexible skirt 80 and are collected by a secondary hydrate conduit 82 and director vent 84.

Flexible skirt 80 may also serve as a turbulence buffer to prevent silt and debris from being disturbed by the flow of warming water from heat distributor 11. Silt that is entrained in water flowing upwards to separator 12 is returned to the ocean floor by a return distributor such as annular shroud 14 and may be directed by jets 71, 73 (shown in FIG. 3) to a settling area of the ocean floor that is at a suitable location generally away from the area of hydrate harvest.

Methane captured by the bell 6 and skirt 80 then travels and expands upward through the conduits toward an engine 10. The engine 10 may be any suitable engine to propel the vessel, including, but not limited to, a turbo generator, a turbine, or a combustion engine.

The engine 10 is powered by expanding harvested methane that travels toward the factory via conduits 8, 82. Considerable energy is available for conversion to motive power by the expanding methane alone or in combination with other natural agents such as water, steam and wind. Such motive power may be used to propel or otherwise facilitate the transport or movement of a vessel in water. Energy produced by the engine 10 provides an important recovery of heat and/or pumping energy that may be used to further warm water delivered to the hydrate deposits by the heat distributor 11. A novel thermodynamic cycle is performed in which heat from surface waters that may be 10° to 30° warmer than water at the ocean floor is used to release methane from hydrates at the ocean floor. Released methane provides a much higher thermodynamic quality and a denser, expansive medium than water vapor that is typically utilized in partial-pressure Ocean Thermal Energy Cycles or OTEC systems. This allows engine 10 to be much smaller and the system to be much less expensive than conventional OTEC systems working in the same conditions of the ocean environment.

In operation, released methane is continuously and rapidly heated by warming waters to achieve the highest thermodynamic properties and highest velocity toward turbine engine 10. Water in primary and secondary conduits 8, 82 is carried upward by the rising methane and is returned to the ocean by downward opening louvers 12. Methane that is trapped in exiting water is recovered by shroud 14a that empties through upward opening louvers to the methane recovery director 16 where recovered methane joins primary methane traveling upward to turbine engine 10.

It is contemplated that heating of water including relatively fresh water that is a product of the decomposition of gas hydrates as described below may be accomplished using a system such as that which is disclosed in U.S. patent application Ser. No. 12/857,546, filed concurrently herewith on Aug. 16, 2010 and titled INCREASING THE EFFICIENCY OF SUPPLEMENTED OCEAN THERMAL ENERGY CONVERSION (SOTEC) SYSTEMS, which is incorporated by reference in its entirety as if fully set forth herein. In this instance it is optionally intended to evaporate such collected water in the cycle disclosed for further energy conversion and purification of water inventories first collected in conjunction with decomposition of gas hydrates.

Additional heating may be supplied by a heat pump assembly 25 particularly in waters that have too little temperature difference between the surface and the ocean floor to release methane from the deposits of hydrate at the desired rate. Heat pump assembly 25, includes a heat exchanger 20 where the working fluid is pressurized to increase the temperature, an expansion device 22 which may be a valve or expansion motor, an input heat exchanger 18 where expanded and cooled working fluid is heated by ocean water, and a compressor or pump 24 that compresses the working fluid into heat exchanger 20. In some embodiments, wherein the expansion device 22 is an expander motor it is preferred to drive an electricity generator or to add the motive power to the drive for pump 24 for energy recovery purposes. In other embodiments, it is preferred to drive compressor 24 with renewable energy such as with a motor using electricity from a turbo generator engine 10 or by an internal combustion engine using methane and/or hydrogen extracted from the produced methane. Heat exchanger 18 may be coupled to the hull of floating factory vessel 2 to expand the area exposed to surrounding warm ocean water. Alternatively, one or more collection lines or inlets 26 may be present to provide a supply of warm surface ocean water from the surrounding ocean water.

In some embodiments, energy to power the components of the floating factory 2 including heat pump 18 may be provided by renewable energy selected from the energy resource group including solar, wind, ocean current, wave, and hydrogen extracted from the renewable methane being harvested from the ocean floor. The use of a heat pump 24 to add heat to surface water warmed by solar energy is a preferred method for heating water found in low solar insulated areas. This is because for every unit of energy applied to compressor 24, three or more units of heat are added to the warm water collected from the ocean surface water, enabling a striking use of solar energy that is captured by the vast expanses of ocean surface. Further, use of a heat pump 24 results in much faster and controlled release of methane from the hydrates at the freezing temperature of the dark ocean floor.

Methane and other gases released by the present invention are separated into hydrocarbons and non-hydrocarbon substances by filter trains 30, 32, 34, 48, 50, 52, as shown in FIG. 1. Each filter train provides very low impedance to methane flow and can be individually removed from operation for maintenance without reducing the throughput of the system.

Figure 5:
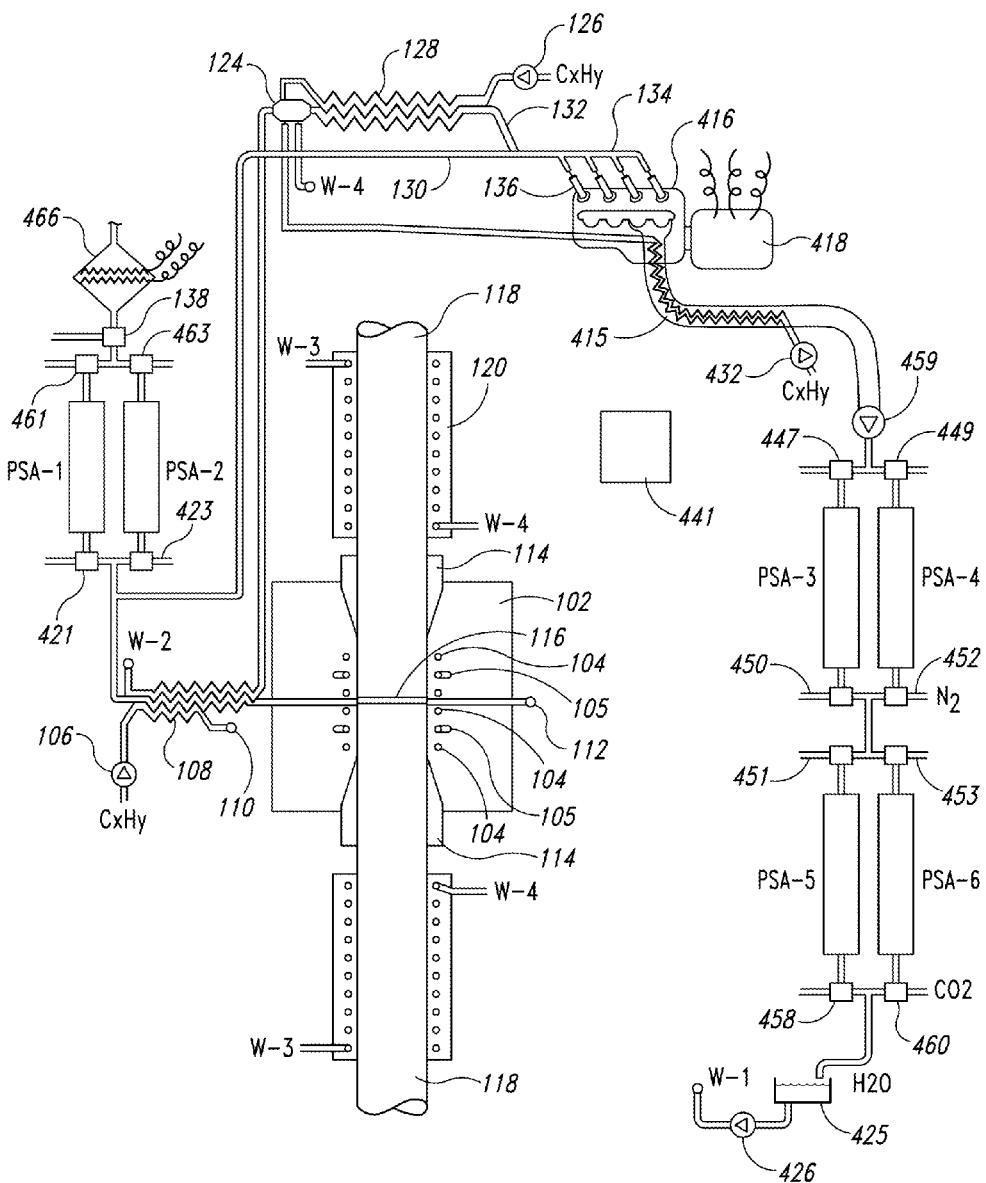
FIG. 5 is a schematic illustration of gas separation and heat transfer components in accordance with an embodiment of the invention.

Referring now to FIGS. 1 and 5, after removal of non-hydrocarbons such as hydrogen sulfide, nitrogen, and water vapor from the gas mixture produced in bell 6, the remaining hydrocarbons are taken to a heat exchanger assembly 108, preheated and then conveyed from port 110 to port 112 of furnace 102 in which graphite is deposited at 1,500° C. to 3,000° C. to form one or more continuously extracted billets 118. Seals 114 prevent gases from escaping from the chamber formed by furnace 102 between opposing billet deposition faces 116. As provided in Equation 2, hydrogen is released and is used in an exothermic reaction with oxygen to preheat incoming methane, water, and air in heat exchanger assembly 108 as shown in FIG. 5.

$$CH_4 + 2O_2 \rightarrow CO_2 + 2H_2O + HEAT \quad \text{Equation 1}$$

$$HEAT + CH_4 \rightarrow C + 2H_2 \quad \text{Equation 2}$$

About 18 Kcal/mol or 32,400 BTU/lb mole $CH_4$ is the required heat addition to decompose methane into carbon and hydrogen as shown in Equation 2. At 80% heat conservation efficiency this requires heat production of about 22.5 Kcal or 40,500/BTU lb mole which may be applied by any combination of applied heat including resistance heating, induction heating or by transfer of combustion heat in combustion annulus 105 as shown according to the reaction of Equation 1. Preheated hydrocarbon inventories can be divided between furnace port 112 for deposition of graphite and combustion annulus 105. Along with preheated air hydrocarbons are fed into combustion annulus 105 for heating furnace 102 with or without assistance by electric heaters 104 as shown.

The higher heating value of methane is 23,890 BTU/lb of $CH_4$. Thus, 1.7 pounds of methane is burned to release 40,500 BTU/mole which is used to convert one mole of methane to one mole of carbon and two moles of hydrogen. At the assigned unit value of $1/$10^6$ BTU for produced $CH_4$, this is a fuel cost of about $0.041 to supply the heat needed to deposit 12 pounds of carbon and release 4 pounds of hydrogen.

Figure 2:
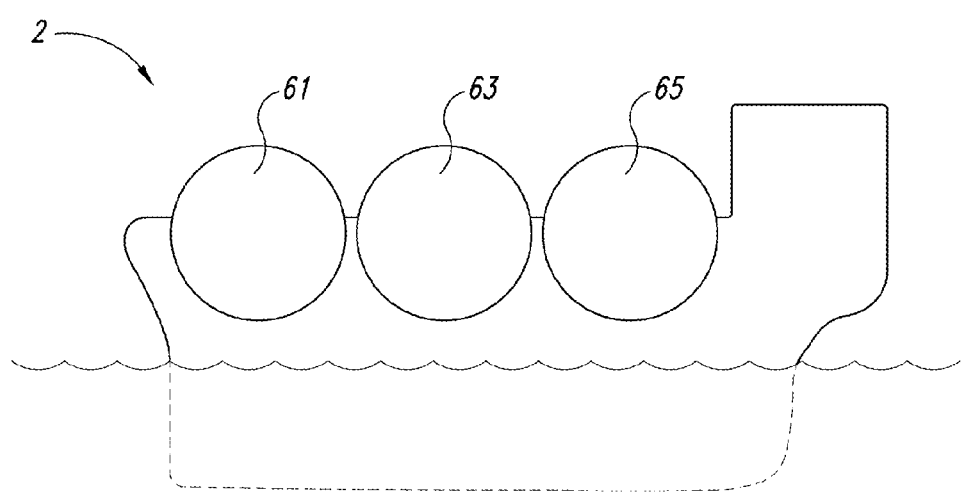
FIG. 2 is a perspective above-water view of the outside of a gas hydrate conversion system in accordance with one embodiment.

The method and system described herein thus provides an efficient way to sequester or store carbon and eliminate a dangerous greenhouse gas threat to Earth's environment. In addition, hydrogen is efficiently produced and may be used in part to cleanly power the factory ship along with other vessels in the sea or it may be transported to shore by pipelines or tanker ships. Hydrogen provides no greenhouse gases such as carbon dioxide or hydrocarbons upon combustion or use in a fuel cell and is greatly needed to for electricity generation and transportation applications in polluted cities of the world. Cooled hydrogen may be stored as a hydride, compressed gas, hydrogenated compound, cryogenic liquid, or slush in storage tanks 61, 63, and 65, as shown in FIG. 2.

After heating steam, incoming air, and methane the hydrogen may further heat ocean water either by direct heat exchange or in conjunction with heat pump 18 to aid in the release of methane from the ocean floor.

Figure 3:
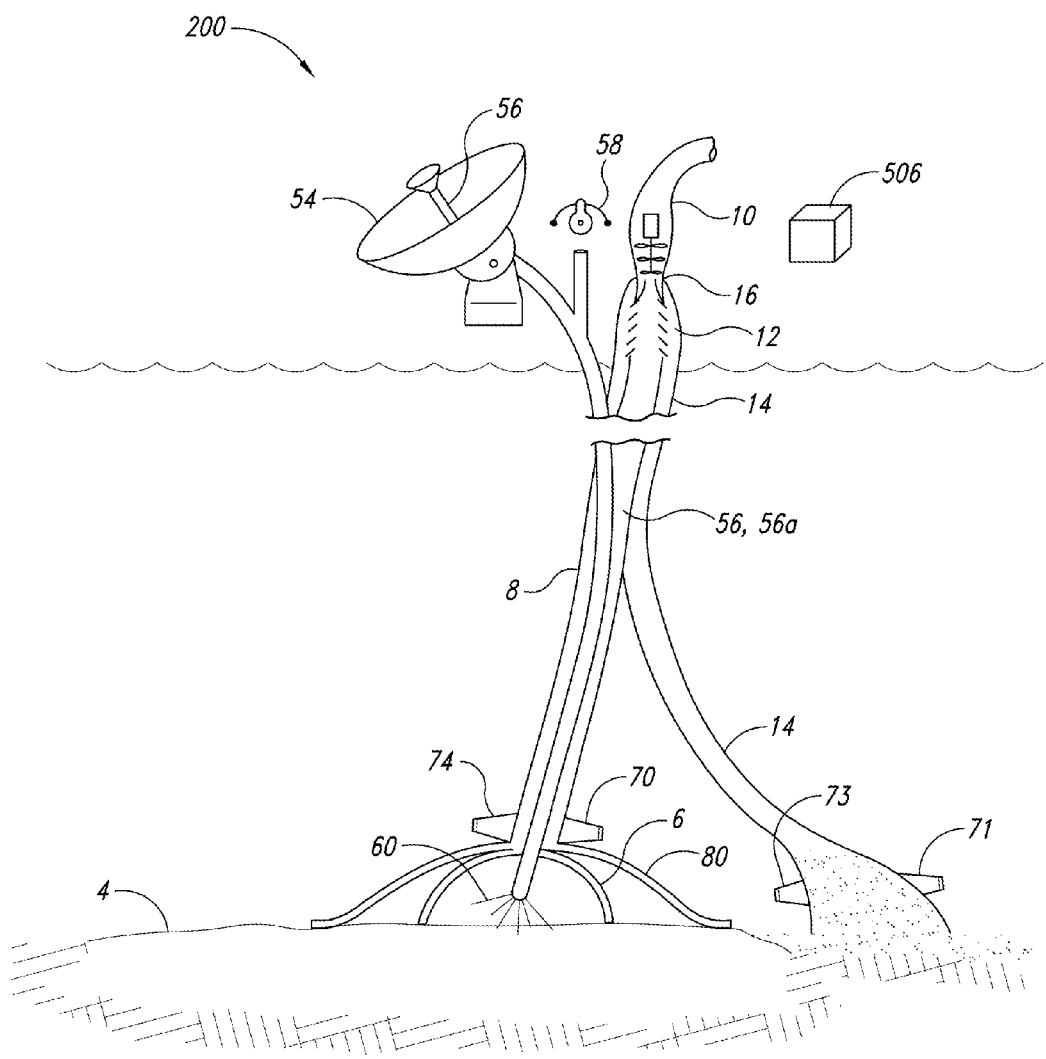
FIG. 3 is a perspective view of a gas hydrate conversion system that extracts methane using a solar energy apparatus in accordance with one embodiment.

According to the embodiments described herein, the bell 6 may be constructed with sufficient weight to maintain its position against the sea floor regardless of the methane release rate from the hydrate deposit 4 being harvested and resulting buoyant forces. The bell 6 may be moved within a horizontal plane to harvest a large surface area hydrate deposit or it may be moved up and down a vertical plane to follow hydrate deposits that have relatively small areas but deep veins. Primary and secondary conduits 8, 82 may be made of flexible tubing or telescoping tubing or combinations of both types for accommodating the situation being harvested. Horizontal propulsion of bell 8 is preferably by occasional jets of water from nozzles 70, 72 (not shown), 74 that are in at least three or more opposing equally spaced locations around the upper portion of bell 6. Suitable position sensors provide guidance of the harvesting appendage 19 and related components including the return location of debris through a return distributor 14 by a central controller 506, as shown in FIG. 3. Central controller 506 also adaptively optimizes operations including tracking of solar concentrator 54, heat pump assembly 25 and other energy conversion operations. In instances that harvesting appendage 19 is controlled to traverse a hydrate deposit 4 with a large area, it is generally preferred to harvest blocks of hydrate deposits 4 by movement of bell 6 by thrust from jets 70, 72 (not shown), 74 as needed to complete a block pattern of extraction and then to move the floating factory to the center of the next block to be harvested.

According to some embodiments, power for propulsion and manufacturing operations is preferably provided by one or more heat engines that utilize thermochemical regeneration principles to increase thermal efficiency (see FIG. 5). Billet(s) 118 are heated by combustion and supplemental heat from resistance or induction heaters 104 within furnace 102 to facilitate rapid decomposition of the methane and to deposit graphite. Graphite is generally the preferred form of carbon deposit because it provides a novel heat conservation methodology. Pyrolytic graphite is highly insulative in the direction perpendicular to the preferred basal plane of deposition. It is highly conductive within the basal planes. Heat released by combustion in channels 105 or input by electrical heating from heaters 104 provides uniform heating of the exposed basal planes for producing a high rate of carbon deposition. After being withdrawn from furnace 102 it is desired to conserve the heat from the hot billets 118 by heating water circulated in a counter-currant heat exchanger 120 as shown. Hot steam from W-4 is used with a portion of the incoming methane to form hydrogen and carbon monoxide as shown in Equation 3, below.

$$CH_4 + H_2O + HEAT \rightarrow H_2 + CO \qquad \text{Equation 3}$$

Heat transfer components and operations for thermochemical regeneration for efficient operation of an engine 416 are provided according to one embodiment. A controller 441 adaptively adjusts the coordinates the adjustment of pumps, valves, and heating operations to optimize the processes described herein. Methane is delivered by a pressure adjusting pump 106 to a heat exchanger 108 where it is heated to a temperature near the its decomposition temperature by a countercurrent heat exchange 120 from hydrogen exiting graphite deposition furnace 102.

After performing pressure swing adsorption (PSA) to separate phase by a set of pressure swing filters PSA-3, PSA-4, PSA-5, PSA-6 by way of three-way valves 450, 451, 452, 453, 458, and 460, water such as distilled quality condensate in port W-1 that is pumped from reservoir 425 is transported and infused through port W-2 by a pump 426, and heated to a temperature near the graphite deposition temperature within the furnace 102 by heat exchanger 108. Hydrogen exits via 104 as shown in FIG. 5. The distilled condensate in port W-1 is added to reactor 124 to provide the water and a portion of the heat needed to complete the reaction of Equation 3. Heat for this reaction is also provided by preheating the mostly methane hydrocarbon by heat transfer in exchanger 128 from the carbon monoxide and hydrogen produced by reactor 124 as shown. Control of the pressure and flow of hydrocarbon into heat exchanger 128 and thus to reactor 124 is provided by feed pump 126 and is coordinated with feed pump 432 and valve 132 to manifold 134 to fuel injectors 136 in engine 416 for control of hydrocarbon delivery to heat exchanger 415 and thus to reactor 124 as shown. Preheated steam formed from W-1 water added at W-3 is also provided by countercurrent heat exchanger 120 to reactor 124 at port W-4 for completion of the reaction of Equation 3.

Engine fuel mixtures of hydrogen and carbon monoxide is delivered across check valve 132 and added to hydrogen delivered by line 130 to engine manifold 134 to power engine 416 and to cool equipment such as generator 418. Hydrogen may also be provided from heat exchanger 108 to be filtered to the desired extent by filter(s) PSA-1 and PSA-2 and coordinated control valves 421, 423, 461 and 463 as shown for use in fuel cell 466 or for chemical purposes from control valve 138. In a preferred embodiment, engine fuel is directly injected into the combustion chambers of engine 416 by fuel injectors 136 as disclosed in co-pending U.S. patent application titled Method and System for Increasing the Efficiency of Solar Ocean Thermal Energy Conversion (SOTEC), filed on Aug. 16, 2010, which is incorporated by reference in its entirety as if fully set forth herein.

Exhaust from engine 416 can be delivered through exhaust pump 459 to PSA-3 and PSA-4 through coordinated control valves 447, 449, 450, and 452 and as needed for further purification by subsequent operations of PSA-5 and PSA-6 through coordinated control valves 451, 453, 458, and 460. Carbon dioxide produced by combustion of carbon monoxide in engine 416 can be reacted with hydrogen to produce methanol for purposes of serving as an easily transported liquid chemical feedstock and/or transportation fuel. Equation 4 shows the overall process.

$$3H_2 + CO_2 \rightarrow H_2O + CH_3OH + HEAT \qquad \text{Equation 4}$$

The process of Equation 4 can be accomplished by liquid phase methanol slurry catalysts at about 250° F. (120° C.) at favorable rates to produce inexpensive methanol.

Nitrogen that is separated from the exhaust of engine 416 can be used as a cover gas for autoclave processing and it can be reacted with hydrogen to form ammonia or a variety of compounds. Equation 5 shows the venerable process of ammonia formation.

$$3H_2 + N_2 \rightarrow 2NH_3 \qquad \text{Equation 5}$$

In some embodiments, sulfur may be utilized in the form of $H_2S$ and other sulfur compounds that are removed from the gas mixture delivered to the filter trains in processes that provide valuable chemicals and fertilizers. For example, ammonium sulfate can be readily produced from such feed stocks using any suitable technology including the well known Saturator, Wilputte, Pickle Liquor or Indirect process. Oleum and/or sulfuric acid may also be produced from sulfur values in the delivered gas mixture.

Similarly, other compounds such as ammonium chloride, ammonium bromide, ammonium iodide, ammonium nitrate, ammonium acetate, ammonium phosphate, and ammonium carbonates may be readily produced according to some embodiments to meet market demand for such products.

According to another embodiment, shown in FIG. 3, solar energy may be harnessed and used to initiate release of gas hydrates in areas that have abundant solar radiation reaching the surface of the ocean. In a preferred embodiment, some embodiments, solar energy is utilized to heat engine generators and photovoltaic arrays to produce electricity and to provide a solar energy apparatus 200 to beam concentrated solar energy to the ocean floor for purposes of heating the hydrate and releasing methane into bell 6. Referring to FIG. 3, the solar energy apparatus 200 may include a solar collector 54 that concentrates and delivers light at incident angles that efficiently conveys the light through a light conduit 56 with highly reflective walls to provide high-intensity delivery of solar energy directly to the areas where methane releases are desired. Delivery of light to the ocean floor, as opposed to warm water delivered by a heat distributor, provides the advantage of causing fewer disturbances of silt and debris.

Light conduit 56 may also include a light pipe 56a of highly transparent medium such as glass or plastic that conducts solar energy to the ocean floor. Both types of light pipes 56a may use an artificial light and parabolic reflector assembly 58 to supplement and/or replace solar energy as needed. Suitable light sources include radiant sources such as catalytic heaters that combust hydrogen or methane to provide mostly infrared output, mantle burners with thorium oxide and rare earths that produce considerable light in the visible spectrum, incandescent lights, fluorescent lights, mercury vapor lights, sodium vapor lights, sulfur vapor lights and many other suitable artificial light sources. Final distribution and sealing of the light pipe is by an array of light distributors 60 as shown within bell 6. The use of solar energy to release methane gas from gas hydrate deposits according to this embodiment may be used alone or in combination with a heat distributor 11 as described above.

Figure 4:
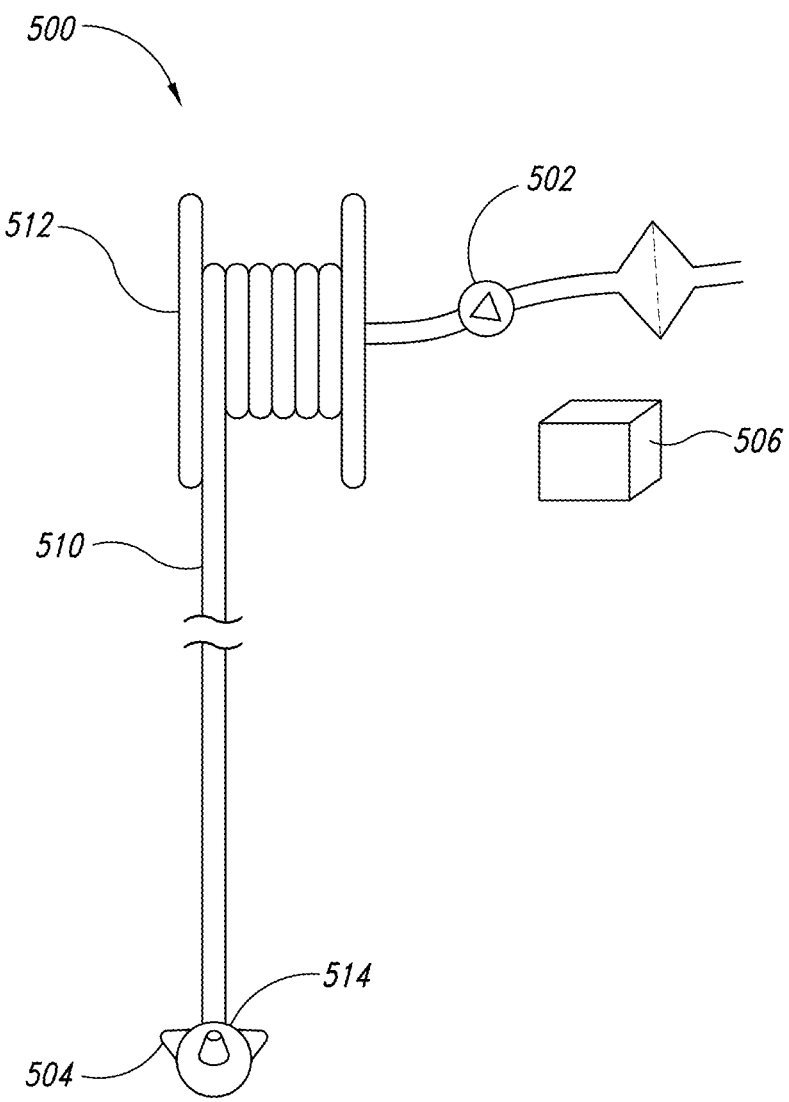
FIG. 4 is a perspective view of a robot spray cleaning system (RSCS) in accordance with one embodiment.

According to yet another embodiment, occasional washing of the methane collection system is provided by high pressure spraying from a robot spray cleaning system (RSCS) 500 as shown in FIG. 4. Cleaning of interior areas is generally more important than cleaning of exterior areas. With all other operations halted, one or more RSCS units may be added through ports at the top of flow director 14 and conduit 8 to clean the inside surfaces as needed to maintain the system in good working order. High pressure pump 502 supplies spray water to one or more RSCS spray units 514.

In operation, the RSCS units assist in propelling themselves by orienting the cleaning sprays 504 in directions that provide thrust in the intended direction of travel. A central controller 506 provides coordination of the spray jet orientations to generally cancel jet thrust by actions of nozzles on opposite sides of the RSCS as shown. Positioning a RSCS at critical areas that need cleaning is accomplished by coordinated measurements of the distance that delivery tubing 510 is extended from storage spool 512 and by the angle and location that an inertial guidance navigation system within each RSCS reports to the central controller 506.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A method for harvesting hydrocarbon hydrate deposits, the method comprising:

providing a gas hydrate conversion system;
inducing release of methane from an oceanic hydrate deposit;
capturing the methane from a primary methane capture zone and/or a secondary methane capture zone;
converting the methane to hydrogen and carbon; and
delivering solar energy to the oceanic hydrate deposit using a solar energy apparatus including a light conduit, the light conduit having reflective walls to provide high-intensity delivery of the solar energy to the oceanic hydrate deposit.

2. The method of claim 1, wherein the gas hydrate conversion system includes a furnace adapted to disassociate one mole of methane into two moles of hydrogen and one mole of carbon.

3. The method of claim 1, wherein inducing release of the gas hydrate is accomplished using heated water or solar energy.

4. The method of claim 1, wherein converting the methane to hydrogen and carbon is accomplished by exposing the methane to heat generated by one or more heat exchange assemblies, one or more heat pump assemblies, or by exothermic reactions between extracted hydrogen, methane, steam and oxygen.

5. The method of claim 1, further comprising utilizing the hydrogen and carbon for producing durable goods.

6. The method of claim 1, further comprising sequestering carbon and storing hydrogen for later use.

7. The method of claim 6, wherein the sequestered carbon is used to produce durable goods.

8. The method of claim 6, wherein the stored hydrogen is used to produce energy.

* * * * *